(12) United States Patent
Lee et al.

(10) Patent No.: US 12,300,564 B2
(45) Date of Patent: May 13, 2025

(54) TRANSISTOR DEVICE STRUCTURE WITH ANGLED WIRE BONDS

(71) Applicant: Wolfspeed, Inc., Durham, NC (US)

(72) Inventors: Kyoung-Keun Lee, Cary, NC (US); Tim McManus, Henderson, NC (US)

(73) Assignee: Wolfspeed, Inc., Durham, NC (US)

( * ) Notice: Subject to any disclaimer, the term of this patent is extended or adjusted under 35 U.S.C. 154(b) by 687 days.

(21) Appl. No.: 17/503,733

(22) Filed: Oct. 18, 2021

(65) Prior Publication Data

US 2023/0124581 A1    Apr. 20, 2023

(51) Int. Cl.
*H01L 23/31* (2006.01)
*H01L 21/56* (2006.01)
*H01L 23/00* (2006.01)

(52) U.S. Cl.
CPC .......... *H01L 23/3192* (2013.01); *H01L 21/56* (2013.01); *H01L 23/3121* (2013.01); *H01L 23/3171* (2013.01); *H01L 24/48* (2013.01); *H01L 2224/48091* (2013.01); *H01L 2224/48247* (2013.01); *H01L 2924/13091* (2013.01)

(58) Field of Classification Search
CPC .......... H01L 23/49562; H01L 23/3107; H01L 29/778
See application file for complete search history.

(56) References Cited

U.S. PATENT DOCUMENTS

| 7,105,379 | B2 | 9/2006 | Tsao et al. |
| 7,417,326 | B2 | 8/2008 | Ikumo et al. |
| 7,601,628 | B2 | 10/2009 | Daubenspeck et al. |
| 8,536,044 | B2 | 9/2013 | Li et al. |
| 8,698,294 | B2 | 4/2014 | Camacho et al. |
| 2006/0255438 | A1 | 11/2006 | Omori et al. |
| 2009/0091036 | A1 | 4/2009 | Chen et al. |
| 2010/0019397 | A1* | 1/2010 | Youn ................... H01L 23/5286 257/784 |
| 2014/0264960 | A1 | 9/2014 | Ring et al. |
| 2015/0221574 | A1 | 8/2015 | Ring et al. |
| 2016/0093748 | A1 | 3/2016 | Mieczkowski et al. |
| 2018/0076151 | A1 | 3/2018 | Min et al. |
| 2018/0082970 | A1 | 3/2018 | Chen et al. |

(Continued)

FOREIGN PATENT DOCUMENTS

WO    2014158308 A1    10/2014

OTHER PUBLICATIONS

International Search Report and Written Opinion for International Application No. PCT/US2020/060959, mailed Feb. 19, 2021, 7 pages.

*Primary Examiner* — Robert G Bachner
(74) *Attorney, Agent, or Firm* — Sage Patent Group

(57) ABSTRACT

A transistor device includes a substrate, a gate contact pad on the substrate, and a transistor die on the substrate adjacent the gate contact pad. The transistor die includes an active region and a gate bond pad adjacent the active region, and the gate bond pad has a side edge adjacent the active region that extends in a first direction. The transistor device includes a bonding wire bonded to the gate contact pad at a first end of the bonding wire and to the gate bond pad at a second end of the bonding wire. The bonding wire extends in a second direction that is oblique to the first direction such that the bonding wire forms an angle relative to the first direction that is less than 90 degrees.

15 Claims, 9 Drawing Sheets

(56) References Cited

U.S. PATENT DOCUMENTS

| | | |
|---|---|---|
| 2019/0326230 A1 | 10/2019 | Bothe et al. |
| 2020/0395322 A1* | 12/2020 | McPherson ............ H01L 24/49 |
| 2021/0175138 A1 | 6/2021 | Lee |

* cited by examiner

TRANSISTOR DEVICE STRUCTURE WITH ANGLED WIRE BONDS

FIELD

The disclosure relates to semiconductor devices, such as transistors, having bond pads and wire bonds.

BACKGROUND

Semiconductor devices are often used in systems that are exposed to a variety of harsh environmental conditions. For example, semiconductor devices may be exposed to extreme temperature ranges, humidity ranges, and/or other environmental conditions that may negatively impact the semiconductor devices. Moreover, semiconductor devices are often required to operate at or near their rated currents and voltages over extended periods of time. Operating in extreme environmental conditions and/or at elevated levels may lead to failure of the devices and/or deterioration in semiconductor device performance.

Surface passivation techniques are typically utilized to encapsulate sensitive surfaces of semiconductor devices in an effort to reduce the deteriorating affects associated with being exposed to extreme environmental conditions. While current passivation techniques have proven to be beneficial, there are still some failure mechanisms due to environmental exposure.

For example, humidity migration in semiconductor devices may reduce their operating life. Humidity migration resistance is typically enhanced by utilizing passivation films and/or environment encapsulation (EE) films on a top of a semiconductor die. However, humidity migration may occur at or near wirebond connections to the semiconductor device, because wirebond connections must penetrate the passivation/encapsulation films. Insufficiently optimized wire bonding processes that allow humidity migration can therefore be a significant failure mechanism for semiconductor devices.

A conventional transistor device 1 is illustrated in FIGS. 1 and 2. FIG. 1 is a schematic illustration of a transistor device 1, while FIG. 2 is a photograph taken with a Nomarksi optical microscope of a portion of a transistor device 1 corresponding to the region in box 25 of FIG. 1.

Referring to FIGS. 1 and 2, the transistor device 1 includes a transistor die 18 mounted on a substrate 10. The transistor die 18 may include, for example, a gallium nitride-based high electron mobility transistor (HEMT). The transistor die 18 includes an active region 15 including a plurality of gate fingers 17 that extend vertically (e.g., in the y-direction) in the illustration shown in FIG. 1 across the active region 15. The gate fingers 17 are connected to gate contact structures 19 that contact a plurality of gate bond pads 14 on the transistor die 18. The gate fingers 17 extend toward a plurality of drain bond pads 16 on the transistor die 18.

The transistor device further includes a gate contact pad 27 and a drain contact pad 29 on the substrate 10. A plurality of bonding wires 20 are attached between the gate bond pads 14 on the transistor die 18 and the gate contact pad 27 on the substrate 10. Likewise, a plurality of bonding wires 21 are attached between the drain bond pads 16 on the transistor die 18 and the drain contact pad 29 on the substrate 10.

Prior to attaching bonding wires 20, 21, an environment encapsulation (EE) film 28 is formed over the transistor die 18 to provide environmental protection as described above.

As can be seen in FIG. 2, when the bonding wires 20, 21 are attached, damage can occur to the EE film 28 on or near the bond pads 14, 16. The EE film 28 may also become damaged on or near the gate contact structures 19. Such damage can provide pathways for undesirable humidity migration, which can cause the transistor device 1 to fail, particularly when the device is operated at high frequencies, high power levels and/or high temperatures for extended periods of time in humid environments.

SUMMARY

A transistor device according to some embodiments includes a substrate, a gate contact pad on the substrate, and a transistor die on the substrate adjacent the gate contact pad. The transistor die includes an active region and a gate bond pad adjacent the active region, and the gate bond pad has a side edge adjacent the active region that extends in a first direction. The transistor device includes a bonding wire bonded to the gate contact pad at a first end of the bonding wire and to the gate bond pad at a second end of the bonding wire. The bonding wire extends in a second direction that is oblique to the first direction such that the bonding wire forms an angle relative to the first direction that is less than 90 degrees.

In some embodiments, the angle is less than 60 degrees, in some embodiments between 30 and 60 degrees, and in some embodiments about 45 degrees.

In some embodiments, the transistor device further includes a plurality of bonding wires bonded to the gate contact pad and to the gate bond pad, wherein each of the plurality of bonding wires extends in the second direction.

The bonding wire may have a diameter greater than 20 microns.

The gate bond pad may include a first gate bond pad and the bonding wire includes a first bonding wire, and the transistor device may further include a second gate bond pad adjacent the active region, and a second bonding wire bonded to the gate contact pad and to the second gate bond pad, wherein the bonding wire extends in the second direction.

The transistor device may further include a first plurality of bonding wires bonded to the gate contact pad and to the first gate bond pad, and a second plurality of bonding wires bonded to the gate contact pad and to the second gate bond pad. Each of the first plurality of bonding wires and the second plurality of bonding wires may extend in the second direction.

The gate bond pad may include a first gate bond pad and the bonding wire includes a first bonding wire, and the transistor device may further include a second gate bond pad adjacent the active region, and a second bonding wire bonded to the gate contact pad and to the second gate bond pad, wherein the bonding wire extends in a third direction that is different from the second direction and that forms a second angle relative to the first direction that is less than 90 degrees.

The transistor device may further include a first plurality of bonding wires bonded to the gate contact pad and to the first gate bond pad, and a second plurality of bonding wires bonded to the gate contact pad and to the second gate bond pad, wherein each of the first plurality of bonding wires extends in the second direction and each of the second plurality of bonding wires extends in the third direction.

The gate bond pad may have a width in a direction perpendicular to the first direction of less than 80 microns.

The transistor device may further include a gate connection structure adjacent the side edge of the gate bond pad and electrically connected to the gate bond pad, and a gate finger connected to the gate connection structure and extending in a third direction perpendicular to the first direction, wherein the second direction forms an oblique angle relative to the third direction.

The transistor device may further include an environment encapsulation film on the transistor die and extending onto the gate bond pad.

The transistor device may further include a drain contact pad on the substrate, a drain bond pad on the transistor die adjacent the active region opposite the gate bond pad, wherein the drain bond pad has a second side edge adjacent the active region that extends in the first direction, and a second bonding wire bonded to the drain contact pad at a first end of the bonding wire and to the drain bond pad at a second end of the bonding wire, wherein the second bonding wire extends in a third direction that is oblique to the first direction such that the second bonding wire forms an angle relative to the first direction that is less than 90 degrees.

The transistor device may further include a first plurality of bonding wires bonded to the gate contact pad and to the gate bond pad, wherein each of the first plurality of bonding wires extends in the second direction, and a second plurality of bonding wires bonded to the drain contact pad and to the drain bond pad, wherein each of the second plurality of bonding wires extends in the third direction.

In some embodiments, the second direction and the third direction may be the same direction, and in other embodiments, the second direction and the third direction may be different directions.

A method of forming a transistor device according to some embodiments includes forming a gate contact pad on a substrate, mounting a transistor die on the substrate adjacent the gate contact pad, wherein the transistor die includes an active region and a gate bond pad adjacent the active region, wherein the gate bond pad has a side edge adjacent the active region that extends in a first direction, and bonding a bonding wire to the gate contact pad at a first end of the bonding wire and to the gate bond pad at a second end of the bonding wire, wherein the bonding wire extends in a second direction that is oblique to the first direction such that the bonding wire forms an angle relative to the first direction that is less than 90 degrees.

A transistor device according to some embodiments includes a substrate, a gate contact pad on the substrate, a transistor die on the substrate adjacent the gate contact pad, wherein the transistor die includes an active region, a gate bond pad adjacent the active region, and a gate finger extending from the gate bond pad in a first direction, and a bonding wire bonded to the gate contact pad at a first end of the bonding wire and to the gate bond pad at a second end of the bonding wire. The bonding wire extends in a second direction that is oblique to the first direction.

The transistor device may further include a plurality of bonding wires bonded to the gate contact pad and to the gate bond pad, wherein each of the plurality of bonding wires extends in the second direction.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
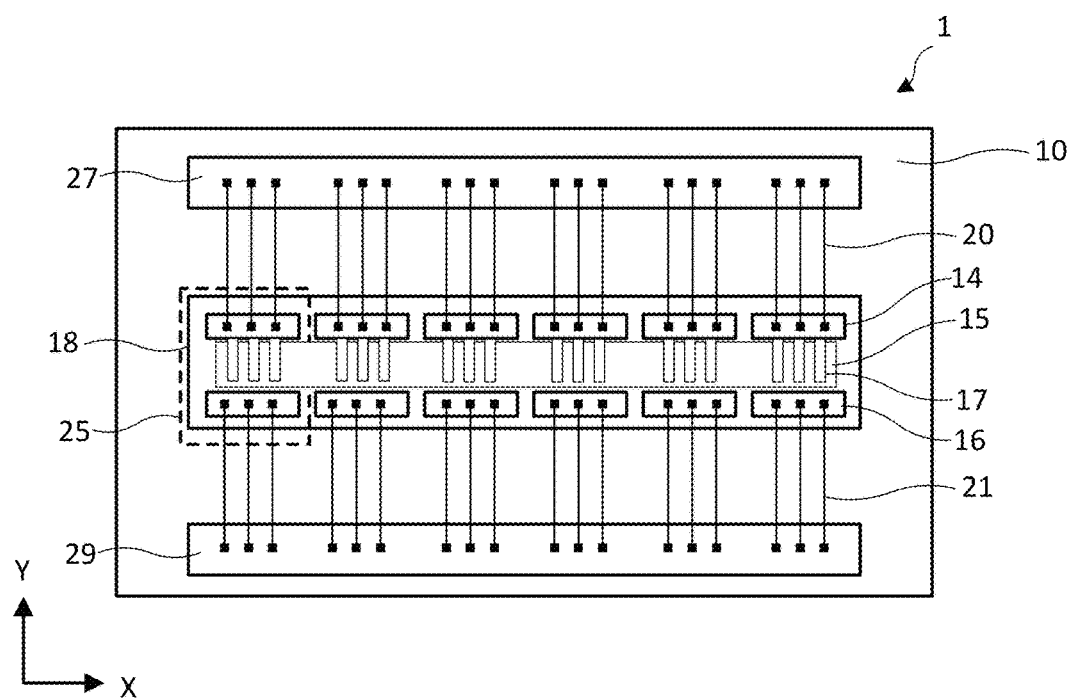
FIG. 1 shows a plan view of a conventional semiconductor device structure.
Figure 2:
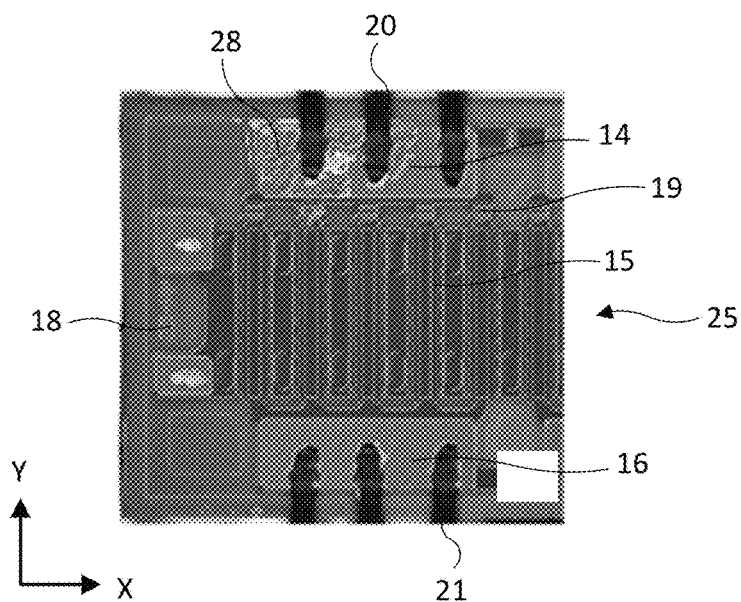
FIG. 2 illustrates a view of a conventional semiconductor device structure observed by a Nomarksi optical microscope.

Embodiments of the inventive concepts are explained more fully with reference to the non-limiting aspects and examples that are described and/or illustrated in the accompanying drawings and detailed in the following description. It should be noted that the features illustrated in the drawings are not necessarily drawn to scale, and features of some embodiments may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure.

As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3A:
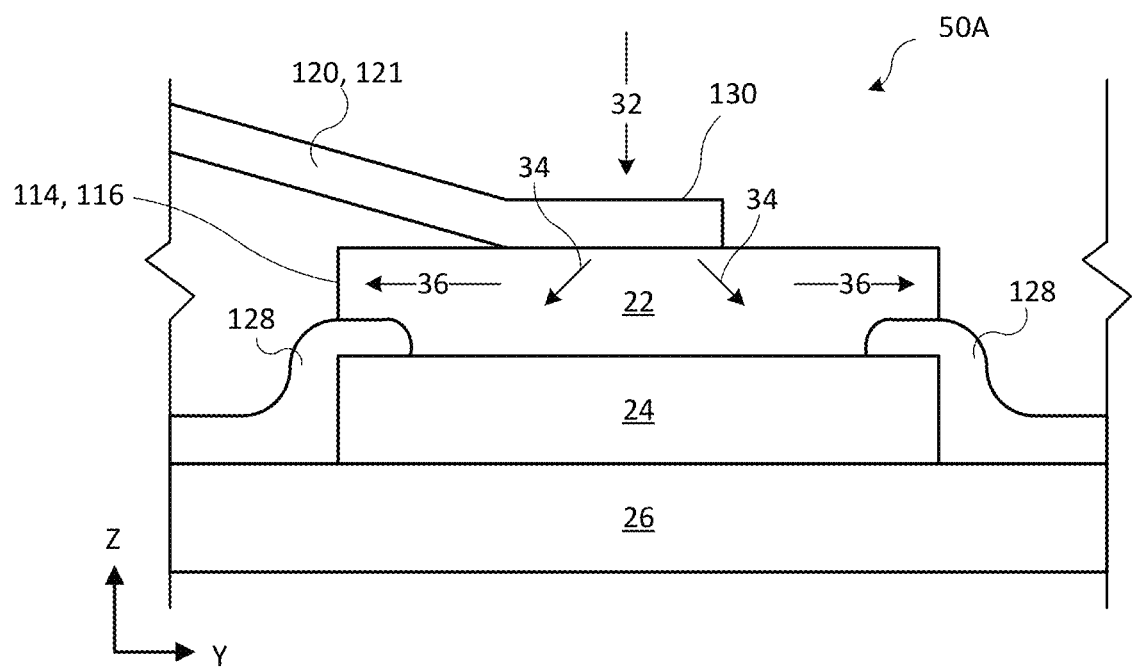
FIGS. 3A and 3B are cross-sectional views of pad structure for a semiconductor devices according to some embodiments.
Figure 3B:
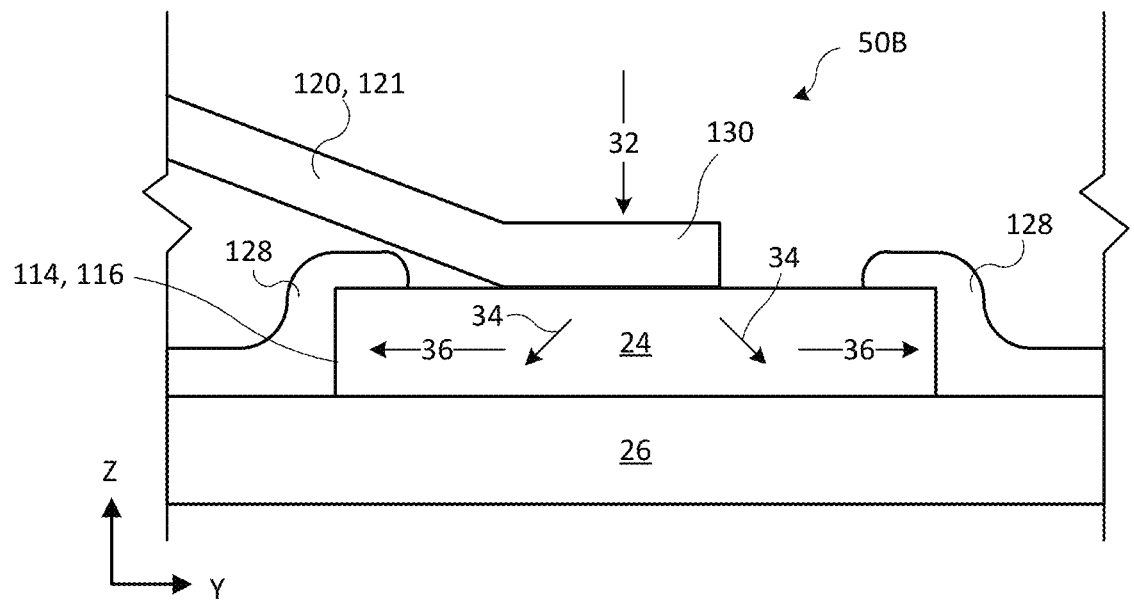

FIGS. 3A and 3B are cross-sectional views of pad structures for a devices according to some embodiments.

Figure 4A:
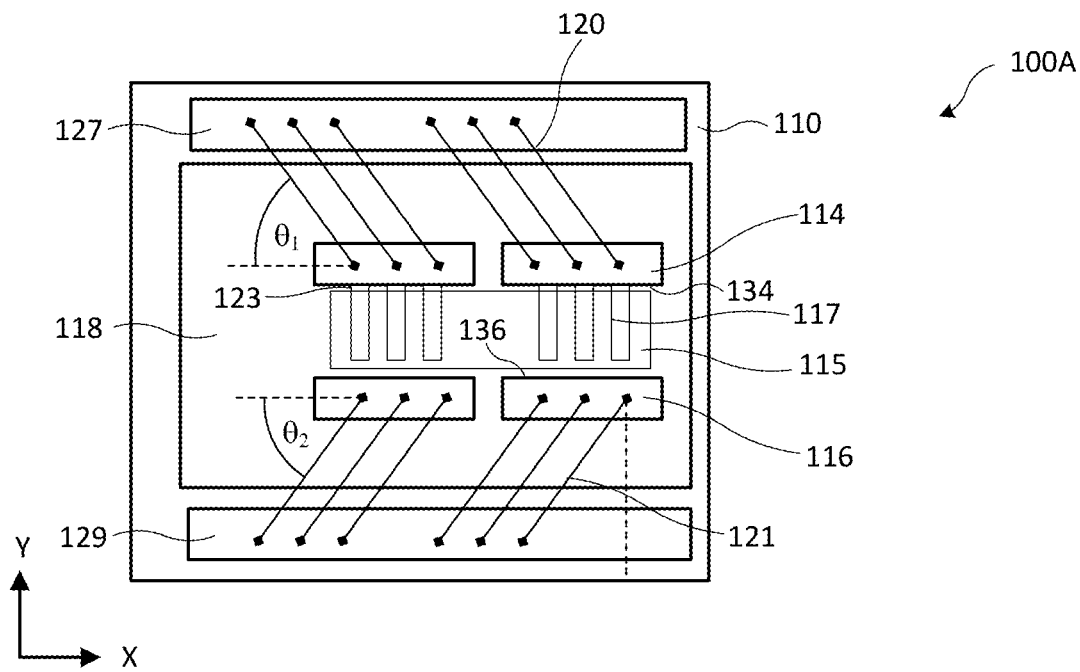
FIGS. 4A, 4B and 5 are plan views of semiconductor device structures according to some embodiments.

In particular, FIG. 3A illustrates a bond pad structure 50A for a semiconductor device. The bond pad structure 50A includes a pad 24 on a semiconductor body portion 26, which may, for example, be a transistor die 118 (FIG. 4A). A supplemental pad 22 is on the pad 24. The pad 24 and supplemental pad 22 may together form a gate bond pad 114 or a drain bond pad 116 as described in more detail below.

A bonding wire 120, 121 is bonded to the supplemental pad 22 in a bond region 130, for example, via thermosonic wedge bonding, thermocompression wedge bonding, ultrasonic wedge bonding, or other wire bonding techniques. The pad structure 50A electrically connects the bonding wire 120, 121 and the semiconductor body portion 26. An environmental encapsulation (EE) film 128 is on the semiconductor body portion 26 and extends onto an upper surface of the pad 24.

The pad 24 may be directly on the semiconductor body portion 26 or electrically connected to the semiconductor body portion 26. In some embodiments, there may be intervening layers or structures between the pad 24 and the semiconductor body portion 26. Likewise, the supplemental pad 22 may be directly on the pad 24 or electrically connected to the pad 24. In some embodiments, there may be intervening layers or structures between the supplemental pad 22 and the pad 24.

The pad 24 may be formed from a metal, such as aluminum (Al), gold (Au), silver (Ag), platinum (Pt), titanium (Ti), silicon (Si), nickel (Ni), copper (Cu), combinations thereof, and/or the like. Additionally, the pad 24 may be formed of multiple layers and/or one or more overlayers of metal such as aluminum (Al), gold (Au), silver (Ag), platinum (Pt), titanium (Ti), silicon (Si), nickel (Ni), copper (Cu), combinations thereof, and/or the like. The pad 24 may be attached to the semiconductor body portion 26 along a lower surface of the pad 24.

The EE film 128 may partially contact and cover the side surfaces of the pad 24. In some embodiments, the EE film 128 may contact and fully cover the side surfaces of the pad 24. Moreover, the EE film 128 may partially contact and partially cover the top surface of the pad 24, leaving a central portion of the top surface free of the EE film 128.

The supplemental pad 22 may be formed from a metal such as aluminum (Al), gold (Au), silver (Ag), platinum (Pt), titanium (Ti), silicon (Si), nickel (Ni), copper (Cu), combinations thereof, and/or the like. Additionally, the supplemental pad 22 may be formed of multiple layers and/or one or more overlayers of metal such as aluminum (Al), gold (Au), silver (Ag), platinum (Pt), titanium (Ti), silicon (Si), nickel (Ni), copper (Cu), combinations thereof, and/or the like. In some embodiments, the material of the supplemental pad 22 may be the same as the material of the pad 24. In some embodiments, the material of the supplemental pad 22 and the material of the pad 24 may be different. In some embodiments, the supplemental pad 22 may include a bottom surface that contacts the top surface of the pad 24. In some embodiments, the bottom surface of the supplemental pad 22 may contact a central portion of the top surface, which may be free of the EE film 128.

The EE film 128 may include a single layer, a plurality of layers having a same type of material, a plurality of layers having different types of material, combinations of material layers, and the like. Additionally, the EE film 128 may include SiN, AlO, SiO, SiO2, AlN, and/or the like. In some embodiments, the EE film 128 may be a passivation layer that is SiN. In some embodiments, the passivation layer may be deposited using a plasma enhanced chemical vapor deposition (PECVD) process and may have a thickness between about 6400 and 9600 Angstroms with a relatively high index of refraction between about 1.85 and 2.25. Other thickness ranges for the passivation layer and index of fraction ranges are contemplated as well. Additionally, the EE film 128 may comprise additional layers arranged below and/or above having a same type of material and/or having different types of material.

In some embodiments, the EE film 128 may be a passivation layer that may be SiO2 that may be deposited using PECVD with a thickness between about 750 and 1250 Angstroms with a relatively low index of refraction between about 1.4 and 1.6. Other thickness ranges for the passivation layer and index of fraction ranges are contemplated as well.

Additionally, the EE film 128 may comprise additional layers arranged below and/or above having a same type of material and/or having different types of material.

In some embodiments, the EE film 128 may be a passivation layer that may be SiN. The passivation layer may be deposited using PECVD with a thickness that may be between about 2200 and 3800 Angstroms with a relatively high index of refraction between about 1.85 and 2.25. Other thickness ranges for the passivation layer and index of fraction ranges are contemplated as well. Additionally, the EE film 128 may comprise additional layers arranged below and/or above having a same type of material and/or having different types of material.

In some embodiments, an encapsulation layer may be provided over the passivation layer. The encapsulation layer may be a polyimide, organic or polymer-based scratch protectant, or the like.

FIG. 3A also illustrates internal forces and/or internal stresses and external forces experienced by the connection of the bonding wire 120, 121 to the supplemental pad 22. In this regard, as the bonding wire 120, 121 is attached to the supplemental pad 22, a force 32, such as sonicated force, may be applied to end of the bonding wire 120, 121 in a bond region 130. The force 32 may be generally applied along a z-axis and/or perpendicular to the top surface. The force 32 may result in forces 34, 36 and/or internal stress within the supplemental pad 22. The forces 34, 36 may subsequently result in forces and/or internal stress within the supplemental pad 22 and/or the pad 24. At least some components of the forces may extend generally along an x-axis as illustrated away from the bonding region 130. These forces and/or stresses may cause damage to the EE film 128, for example, on or near sidewalls of the supplemental pad 22 where such forces and/or stresses may concentrate.

FIG. 3B illustrates an alternative bond pad structure 50B for a semiconductor device that omits the supplemental pad 22. In the bond pad structure 50B, the bonding wire 120, 121 is bonded directly to an upper surface of the pad 24. As with the embodiment shown in FIG. 3A, internal forces and/or stresses 34, 36 may be imparted to the pad 24 when a force 32 is applied to the bonding wire 120, 121 in the bonding region 130. Such forces and/or stresses may cause damage to the EE film 128.

As noted above, a wire bonding process may have a yield loss because of manufacturing uncertainties, including a touch down issue which applies more force to a bond pad due to a bended seeding wire issue. Accordingly, some embodiments change the wire bonding angle from package side to die pads from perpendicular to the sidewalls of the bond pads to an oblique direction. The oblique wire boding direction may change the direction of the mechanical stress applied to the gate connection structure that electrically connects the gate contact pad and gate fingers. The detoured mechanical stress direction may reduce the probability of damage to the gate connection structure as a result of mislocated or over-forced wire bondings.

In particular, FIG. 4A is a plan view of a semiconductor device structure 100A according to some embodiments. The semiconductor device structure 100A includes a substrate 110 on which a transistor die 118 is mounted. The substrate 110 includes a gate contact pad 127 and a drain contact pad 129 on opposite sides of the transistor die 118.

The transistor die 118 may be, for example, a gallium nitride based high electron mobility transistor (HEMT), but could be or include other types of semiconductor devices, such as a MESFET, a LDMOS transistor, MOSFET, etc. The semiconductor die may include other types of semiconductor materials, such as silicon, silicon carbide, gallium arsenide, etc.

The transistor die 118 includes a plurality of gate bond pads 114 and drain bond pads 116 which are respectively disposed on opposite sides of an active region 115. A plurality of gate fingers 117 are connected to the gate bond pads 114 by gate connection structures 123, and extend in a vertical direction from the gate bond pads 114 toward the drain bond pads 116. The gate bond pad 114 has a side edge 134 adjacent the active region 115 that extends in a direction perpendicular to the gate fingers 117. Likewise, the drain bond pad 116 has a side edge 136 adjacent the active region 115 that extends in the direction perpendicular to the gate fingers 117. The gate connection structures 123 comprise metallized regions that electrically connect the gate fingers 117 to the gate bond pads 114.

In the example illustrated in FIG. 4A, the gate fingers 117 extend in the y-direction, the side edges 134, 136 extend in the x-direction, and the gate bond pads 114 and drain bond pads 116 are spaced apart from one another in the x-direction. Although two gate bond pads 114 and two drain bond pads 116 are shown in the example of FIG. 4A, it will be appreciated that a production device may have more than two gate bond pads 114 and/or more than two drain bond pads 116.

A plurality of bonding wires 120 are connected between the gate contact pad 127 and the gate bond pads 114 on one side of the substrate 110, and a plurality of bonding wires 121 are connected between the drain contact pad 129 and the drain bond pads 116 on the other side of the substrate 110. In particular embodiments, a plurality of bonding wires 120 are connected between each gate bond pad 114 and the gate contact pad 127. Although three bonding wires 120 are connected to each gate bond pad 114 in the example shown in FIG. 4A, it will be appreciated that there may be more or fewer bonding wires 120 connected to each gate bond pad 114. Similarly, a plurality of bonding wires 121 are connected between each drain bond pad 116 and the drain contact pad 129. Although three bonding wires 121 are connected to each drain bond pad 116 in the example shown in FIG. 4A, it will be appreciated that there may be more or fewer bonding wires 121 connected to each drain bond pad 116.

In some embodiments, all of the bonding wires 120 connected to a given gate bond pad 114 are parallel to one another (i.e. extend in the same direction), and all of the bonding wires 121 connected to a given drain bond pad 116 are parallel to one another as shown in FIG. 4A. However, other configurations are possible.

The bonding wires 120 may be bonded to the gate contact pad 127 and the gate bond pads 114, and the bonding wires 121 may be bonded to the drain contact pad 129 and the drain bond pads 116, respectively, using thermosonic wedge bonding, thermocompression wedge bonding, ultrasonic wedge bonding, or other wire bonding techniques.

As seen in FIG. 4A, the bonding wires 120 extend in a direction that forms an oblique angle $\theta_1$ relative to the direction along which the side edges 134, 136 extend (i.e., the x-direction in FIG. 4A). That is, in contrast with prior approaches, the bonding wires 120 are not formed to be perpendicular to the side edges 134, 136 and parallel to the gate fingers 117. In some embodiments, the angle $\theta_1$ may be less than 90 degrees. In some embodiments, angle $\theta_1$ may be less than 85 degrees. In some embodiments, angle $\theta_1$ may be less than 70 degrees. In some embodiments, angle $\theta_1$ may be less than 60 degrees. In some embodiments, angle $\theta_1$ may be between 30 and 60 degrees. In some embodiments, angle $\theta_1$ may be between 40 and 50 degrees. In some embodiments, angle $\theta_1$ may be between about 45 degrees. It will be appreciated that although all of the bonding wires 120 illustrated in FIG. 4A are formed at the same angle $\theta_1$ relative to the x-axis, the bonding wires 120 may be formed at different angles relative to the x-axis.

Similarly, the bonding wires 121 are formed at an oblique angle $\theta_2$ relative to the direction along which the gate fingers 117 extend (i.e., the y-axis in FIG. 4A). That is, the bonding wires 121 are not formed to be parallel to the gate fingers 117. In some embodiments, angle $\theta_2$ may be less than 70 degrees. In some embodiments, angle $\theta_1$ may be less than 60 degrees. In some embodiments, angle $\theta_2$ may be between 30 and 60 degrees. In some embodiments, angle $\theta_2$ may be between 40 and 50 degrees. In some embodiments, angle $\theta_2$ may be between about 45 degrees. It will be appreciated that although all of the bonding wires 120 illustrated in FIG. 4A are formed at the same angle $\theta_2$ relative to the x-axis, the bonding wires 120 may be formed at different angles relative to the x-axis.

Although the angles $\theta_1$ and $\theta_2$ are illustrated in FIG. 4A as being similar, they may be different in some embodiments.

In the embodiment illustrated in FIG. 4A, the angles $\theta_1$ and $\theta_2$ are rotated in opposite circumferential directions relative to the x-axis, so that both sets of bonding wires 120, 121 extend away from the respective bond pads 114, 116 in the same direction (e.g., in the −x direction in FIG. 4A).

Figure 4B:
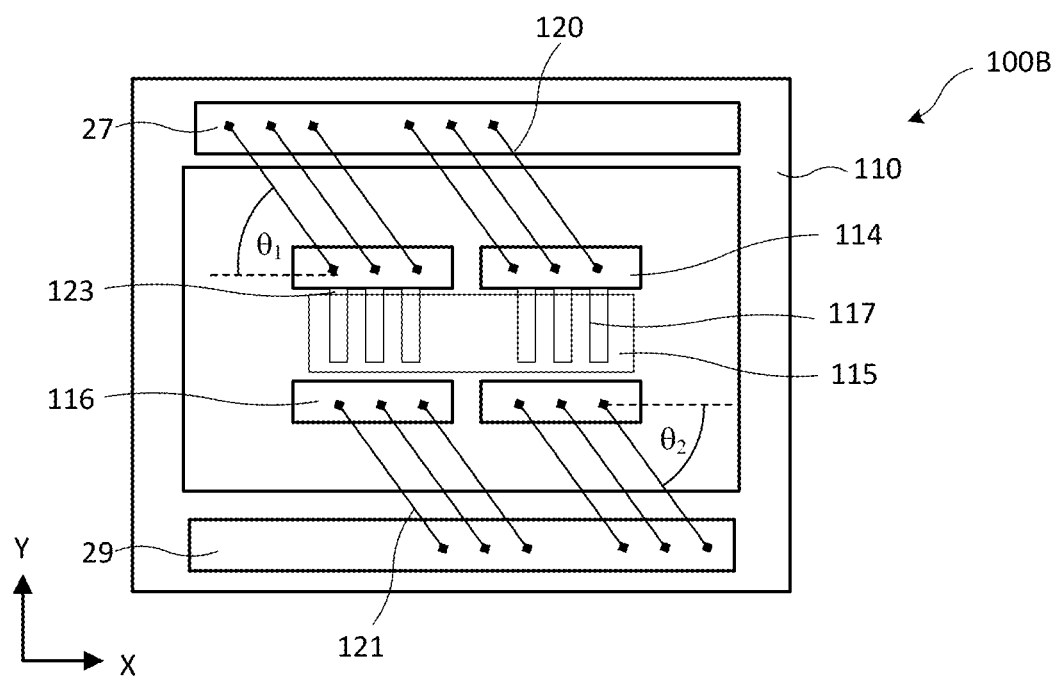

Referring to FIG. 4B, a device structure 100B is illustrated. The device structure 100B is similar to the device structure 100A shown in FIG. 4A, except that in the device structure 100B, the angles $\theta_1$ and $\theta_2$ are rotated in the same circumferential direction relative to the x-axis, so that the bonding wires 120 extend away from the respective bond pads 114 in a first direction (e.g., the −x direction), and the bonding wires 121 extend away from the respective bond pads 116 in a second direction (e.g., the +x direction), opposite the first direction.

Figure 5:
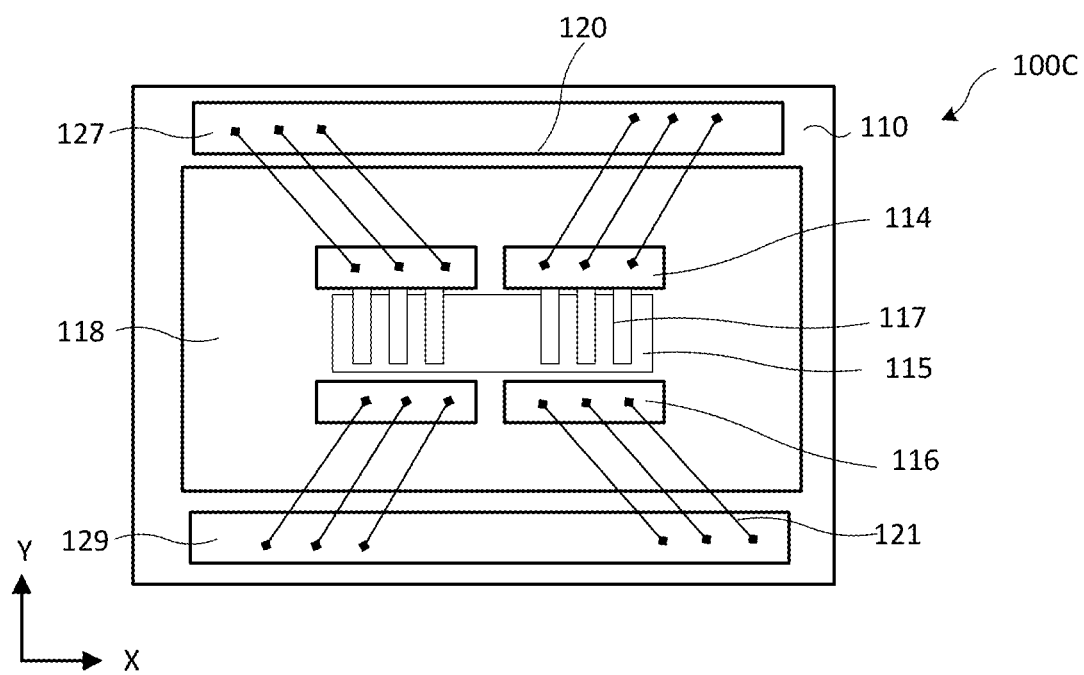

FIG. 5 illustrates an embodiment including a device structure 100C in which the bonding wires 120 have different bonding angles from one another and the bonding wires 121 have different bonding angles from one another. In the embodiment of FIG. 5, each group of bonding wires 120, 121 connected to a given bond pad 114, 116 have substantially the same angle relative to the x-axis.

Figure 6:
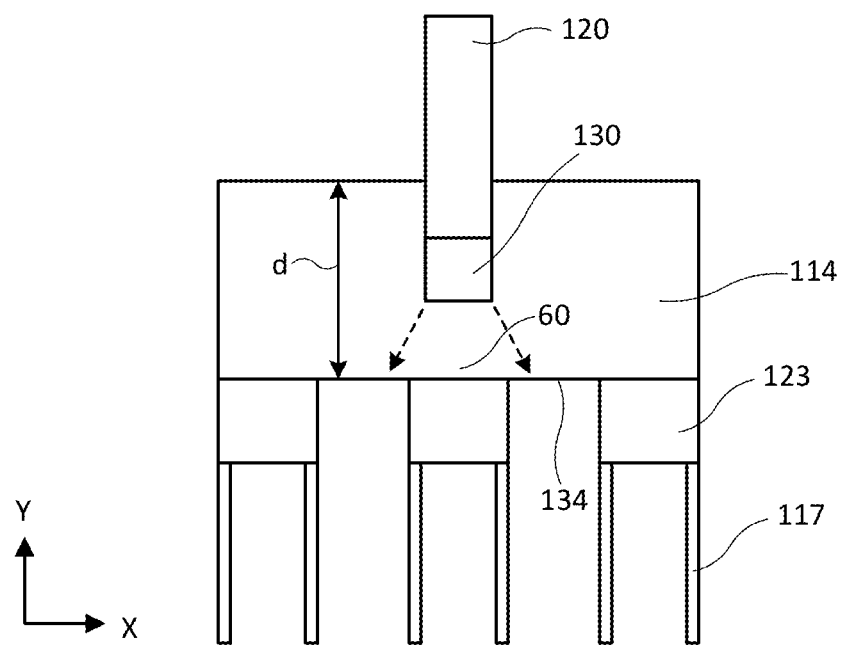
FIGS. 6 and 7 illustrate wire bonds for semiconductor device structures according to some embodiments.

FIG. 6 illustrates a conventional arrangement in which the bonding wires 120 that are bonded to the gate bond pad 114 extend in a direction parallel to the gate fingers 117 (e.g., the y-direction) and perpendicular to a side edge 134 of the gate bond pad 114 connected to the gate fingers 117 (e.g., the x-direction). Stress applied to the bonding region 130 during the bonding process may propagate in the gate bond pad 114 and become concentrated near a gate connection structure 123 in a relatively small region 60 at the side edge 134 of the gate bond pad 114 adjacent the gate connection structures 123. The concentration of stresses may damage an EE film 128 formed on the transistor die 118.

Figure 7:
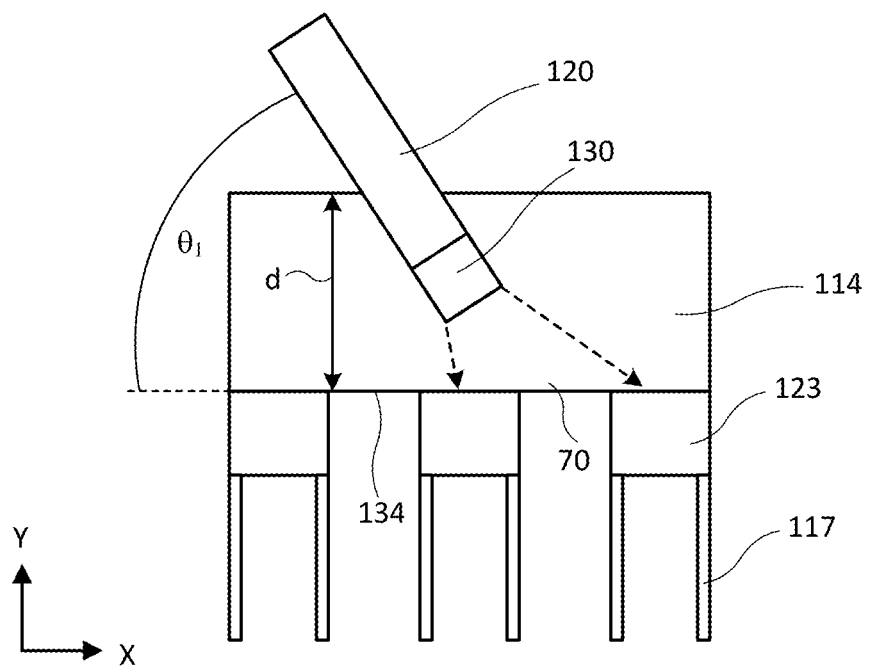

In contrast, FIG. 7 illustrates an arrangement according to some embodiments in which the bonding wires 120 extend in a direction that is not perpendicular to the side edge 134 of the gate bond pad 114, i.e., that is oblique to both the direction of the side edge 134 and the direction along which the gate fingers 117 extend. Although not wishing to be bound by a particular theory of operation, with this configuration, it is believed that stress applied to the bonding region 130 during the bonding process may be spread over a larger region 70 near the gate connection structure 123 at the side edge 134 of the gate bond pad 114, thereby reducing the incidence of damage to the EE film 128 in the neighborhood of the gate connection structure 123.

Accordingly, some embodiments may alter the mechanical stress propagation that can occur during the wirebonding process to reduce the possibility of damaging the structures near the bond pad areas of the device, including the gate connection structures. As a result, some embodiments may improve device life times by enhancing the moisture ingress protection.

Moreover, even with changing the direction of the bonding wires 120, 121 as described herein, the number of bonding wires per pad can be the same as the conventional method of three wires per pad. However, in some embodiments, the number of bonding wires used to connect to each bond pad 114, 116 may be reduced by using thicker wires without degrading RF performance. For example, in some embodiments, the device may include two wires per bond pad, each wire having a diameter of more than 20 microns, and in some embodiments more than 50 microns.

Additionally, changing the direction of the bonding wires 120, 121 as described herein, one or more dimensions of the bond pads can be made smaller to save more space per die, which may resulting in increasing number of dies per wafer. For example, referring to FIGS. 6 and 7, the width d of the bond pads 114, 116 in the direction perpendicular to the side edges 134 may be reduced from, for example, 200 microns to less than 80 microns, such as to 50 microns.

Figure 8:
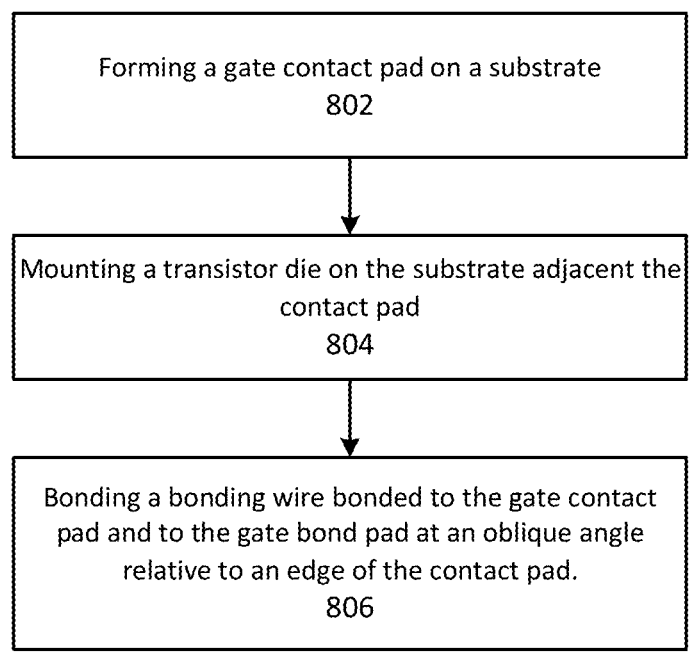
FIG. 8 is a flowchart illustrating operations for manufacturing a semiconductor device according to some embodiments.

FIG. 8 illustrates operations for transistor device according to some embodiments. The operations include forming a gate contact pad on a substrate (block 802), and mounting a transistor die on the substrate adjacent the contact pad (block 804). The transistor die includes an active region and a gate bond pad adjacent the active region, and the gate bond pad has a side edge adjacent the active region that extends in a first direction. The method further includes bonding a bonding wire to the gate contact pad at a first end of the bonding wire and to the gate bond pad at a second end of the bonding wire (block 806). The bonding wire extends in a second direction that is oblique to the first direction such that the bonding wire forms an angle relative to the first direction that is less than 90 degrees.

Transistor devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 9A-9C.

Figure 9A:
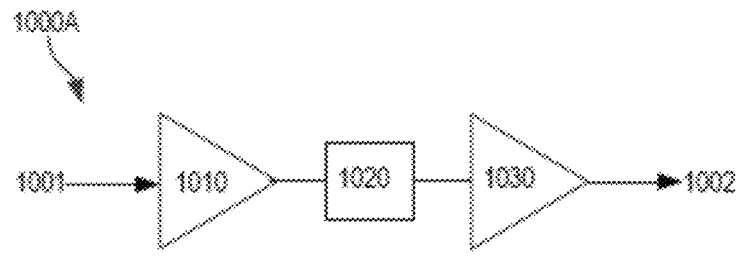
FIGS. 9A-9C are schematic block diagrams of multi-amplifier circuits in which RF transistor amplifiers incorporating transistor devices according to embodiments may be used.

Referring to FIG. 9A, an RF transistor amplifier 1000A is schematically illustrated that includes a pre-amplifier 1010 and a main amplifier 1030 that are electrically connected in series. As shown in FIG. 9A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 9A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 9B:
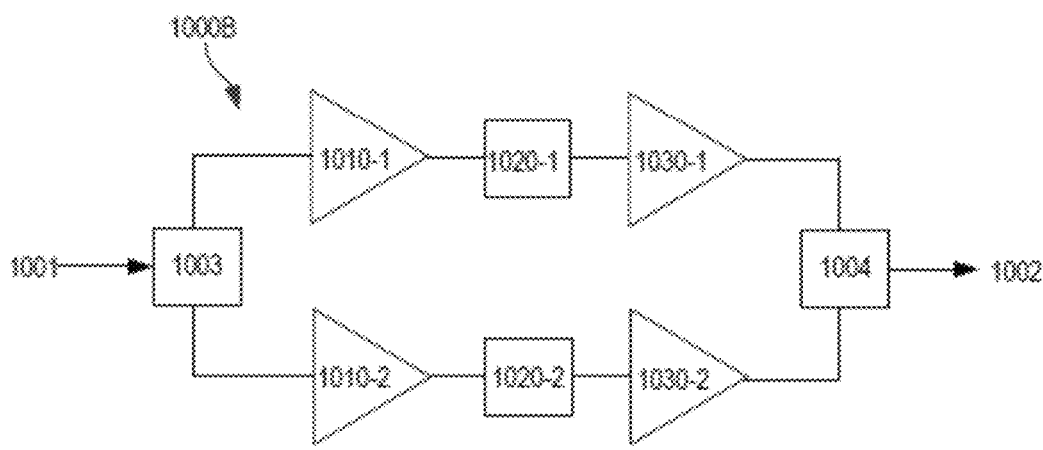

Referring to FIG. 9B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 9C:
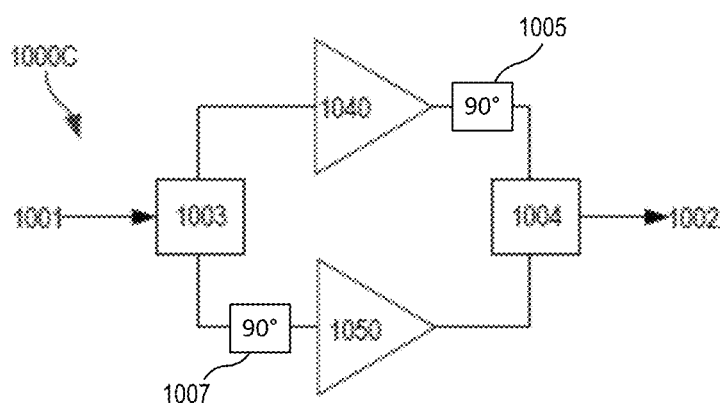

As shown in FIG. 9C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 9C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 10:
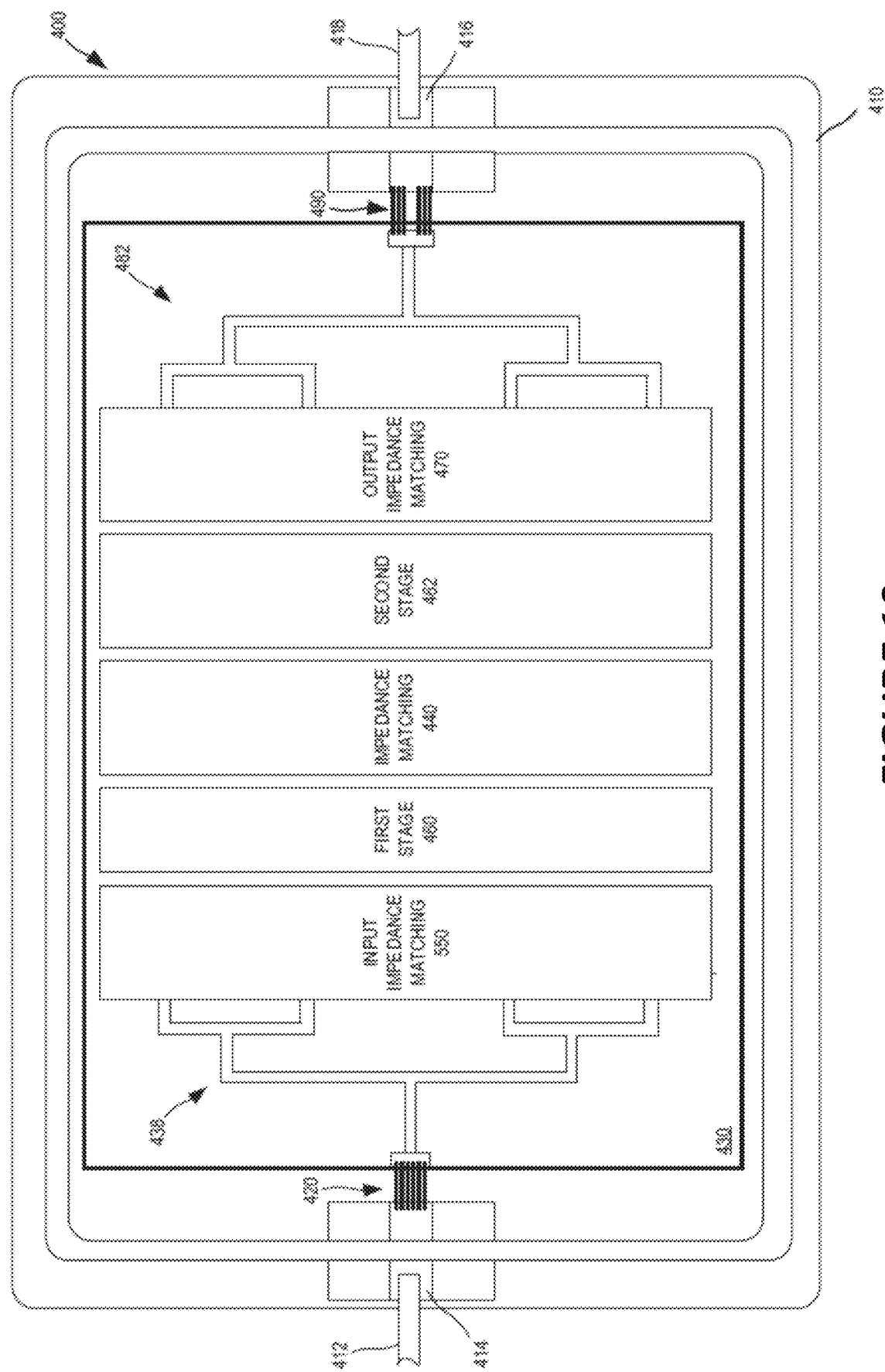
FIG. 10 is a schematic illustration of a MMIC amplifier including a HEMT transistor according to some embodiments.

FIG. 10 is a plan view of a MMIC RF transistor amplifier 400 according to embodiments of the present inventive concepts. As shown in FIG. 10, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 11A:
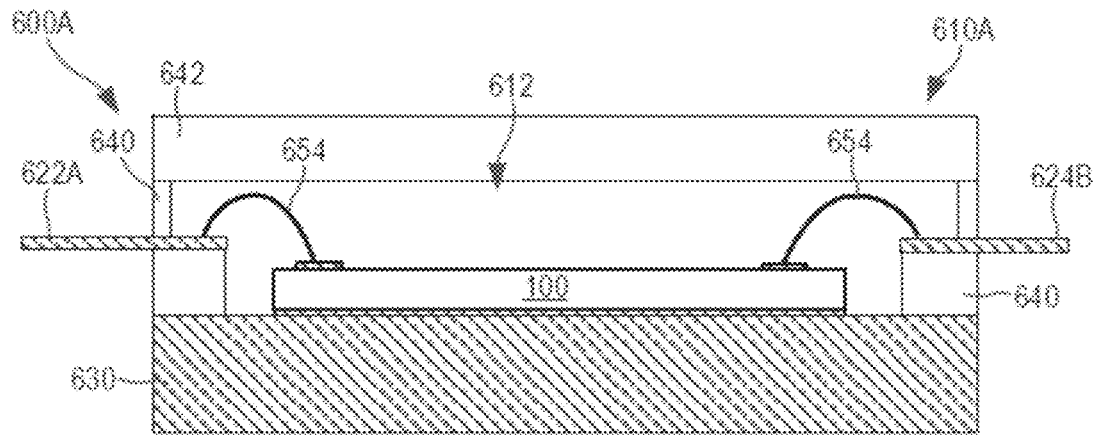
FIGS. 11A and 11B are schematic cross-sectional views illustrating example packages for RF transistor amplifier dies according to some embodiments.
Figure 11B:
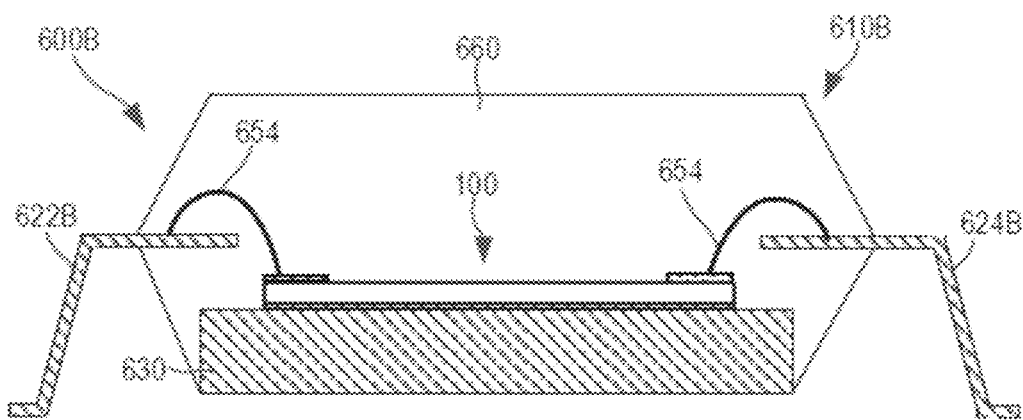

FIGS. 11A and 11B are schematic cross-sectional views illustrating several example ways that that the RF transistor amplifier dies according to embodiments of the present inventive concepts may be packaged to provide packaged RF transistor amplifiers 600A and 600B, respectively.

FIG. 11A is a schematic side view of a packaged Group III nitride-based RF transistor amplifier 600A. As shown in FIG. 11A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, Al2O3. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the structure, while the source terminal is on the bottom side of the structure.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors. This heat may be transferred though the source vias 146 and the semiconductor layer structure of the device to the source terminal and then to the metal submount 630.

FIG. 11B is a schematic side view of another packaged Group Ill nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Accordingly, the disclosure has provided processes and devices for die pads and semiconductors having die pads having improved environmental protection to address extreme temperature ranges, humidity ranges, and/or a host of other environmental conditions. Moreover, the disclosure has provided processes and devices for die pads and semiconductors having die pads having improved environmental protection to address operation at or near rated currents and voltages over extended periods of time. Additionally, the disclosure has provided processes and devices for die pads and semiconductors having die pads having improved environmental protection to address manufacturing issues such as insufficiently optimized wire bonding processes as well as others. Moreover, the disclosure has provided processes and devices for die pads and semiconductors having die pads to reduce damage to an EE film 18, such as sidewall cracks that may result in a degraded device life and/or deterioration in semiconductor performance. Additionally, the disclosure has provided processes and devices for die pads and semiconductors having die pads to reduce a degraded device life and/or deterioration in semiconductor performance.

A transistor device according to some embodiments may be utilized in power semiconductor devices and/or applications. In some embodiments, the power semiconductor devices may be utilized for a power module that may include structure optimized for state-of-the-art wide band gap power semiconductor devices such as Gallium Nitride (GaN), Silicon Carbide (SiC), and the like, which are capable of carrying high amounts of currents and voltages and switching at increasingly faster speeds in comparison with established technologies. The power devices may include Wide Band Gap (WBG) semiconductors, including Gallium Nitride (GaN), Silicon Carbide (SiC), and the like, and offer numerous advantages over conventional Silicon (Si) as a material for the power devices. Nevertheless, various aspects of the disclosure may utilize Si type power devices and achieve a number of the benefits described herein.

A transistor device according to some embodiments may be utilized in radio frequency (RF) applications. In particular, a transistor device according to some embodiments may be utilized in wireless base stations that connect to a wireless device. In further aspects, the transistor device may be utilized in in wireless communication devices.

In aspects, the dimensions of z and/or d may be critical in order to address extreme temperature ranges, humidity ranges, and/or a host of other environmental conditions; operation at or near rated currents and voltages over extended periods of time; and address manufacturing issues such as insufficiently optimized wire bonding processes as well as others.

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

The invention claimed is:

1. A transistor device, comprising:
a substrate;
a gate contact pad on the substrate;
a transistor die on the substrate adjacent the gate contact pad, wherein the transistor die comprises an active region and a gate bond pad adjacent the active region, wherein the gate bond pad has a side edge adjacent the active region that extends in a first direction; and
a plurality of bonding wires bonded to the gate contact pad at a first end of each of the plurality of bonding wires and to the gate bond pad at a second end of each of the plurality of bonding wires;
wherein each of the plurality of bonding wires extends in a second direction that is oblique to the first direction such that each of the plurality of bonding wires forms an angle relative to the first direction that is less than 60 degrees, and wherein the bonding wire has a diameter greater than 20 microns.

2. The transistor device of claim 1, wherein the angle is between 30 and 60 degrees.

3. The transistor device of claim 1, wherein the angle is about 45 degrees.

4. The transistor device of claim 1, wherein the gate bond pad comprises a first gate bond pad and the bonding wire comprises a first bonding wire, the transistor device further comprising:
   a second gate bond pad adjacent the active region; and
   a second bonding wire bonded to the gate contact pad and to the second gate bond pad;
   wherein the bonding wire extends in the second direction.

5. The transistor device of claim 4, wherein the transistor device further comprises:
   a first plurality of bonding wires bonded to the gate contact pad and to the first gate bond pad; and
   a second plurality of bonding wires bonded to the gate contact pad and to the second gate bond pad;
   wherein each of the first plurality of bonding wires and the second plurality of bonding wires extends in the second direction.

6. The transistor device of claim 1, wherein the gate bond pad comprises a first gate bond pad and the bonding wire comprises a first bonding wire, the transistor device further comprising:
   a second gate bond pad adjacent the active region; and
   a second bonding wire bonded to the gate contact pad and to the second gate bond pad;
   wherein the bonding wire extends in a third direction that is different from the second direction and that forms a second angle relative to the first direction that is less than 90 degrees.

7. The transistor device of claim 6, wherein the transistor device further comprises:
   a first plurality of bonding wires bonded to the gate contact pad and to the first gate bond pad; and
   a second plurality of bonding wires bonded to the gate contact pad and to the second gate bond pad;
   wherein each of the first plurality of bonding wires extends in the second direction and each of the second plurality of bonding wires extends in the third direction.

8. The transistor device of claim 1, wherein the gate bond pad has a width in a direction perpendicular to the first direction of less than 80 microns.

9. The transistor device of claim 1, further comprising:
   a gate connection structure adjacent the side edge of the gate bond pad and electrically connected to the gate bond pad; and
   a gate finger connected to the gate connection structure and extending in a third direction perpendicular to the first direction;
   wherein the second direction forms an oblique angle relative to the third direction.

10. The transistor device of claim 1, further comprising an environment encapsulation film on the transistor die and extending onto the gate bond pad.

11. The transistor device of claim 1, wherein the bonding wire comprises a first bonding wire and the side edge comprises a first side edge, the transistor device further comprising:
    a drain contact pad on the substrate;
    a drain bond pad on the transistor die adjacent the active region opposite the gate bond pad, wherein the drain bond pad has a second side edge adjacent the active region that extends in the first direction; and
    a second bonding wire bonded to the drain contact pad at a first end of the bonding wire and to the drain bond pad at a second end of the bonding wire;
    wherein the second bonding wire extends in a third direction that is oblique to the first direction such that the second bonding wire forms an angle relative to the first direction that is less than 90 degrees.

12. The transistor device of claim 11, wherein the transistor device further comprises:
    a first plurality of bonding wires bonded to the gate contact pad and to the gate bond pad, wherein each of the first plurality of bonding wires extends in the second direction; and
    a second plurality of bonding wires bonded to the drain contact pad and to the drain bond pad, wherein each of the second plurality of bonding wires extends in the third direction.

13. The transistor device of claim 12, wherein the second direction and the third direction are the same direction.

14. The transistor device of claim 12, wherein the second direction and the third direction are different directions.

15. A method of forming a transistor device, comprising:
    forming a gate contact pad on a substrate;
    mounting a transistor die on the substrate adjacent the gate contact pad, wherein the transistor die comprises an active region and a gate bond pad adjacent the active region, wherein the gate bond pad has a side edge adjacent the active region that extends in a first direction; and
    bonding a plurality of bonding wires to the gate contact pad at a first end of each of the plurality of bonding wires and to the gate bond pad at a second end of each of the plurality of bonding wires;
    wherein each of the plurality of bonding wires extends in a second direction that is oblique to the first direction such that each of the plurality of bonding wires forms an angle relative to the first direction that is less than 60 degrees and wherein the bonding wire has a diameter greater than 20 microns.

\* \* \* \* \*